United States Patent [19]

Davis et al.

[11] 3,761,787

[45] Sept. 25, 1973

[54] METHOD AND APPARATUS FOR ADJUSTING TRANSISTOR CURRENT

[75] Inventors: Walter Richard Davis, Tempe; James E. Solomon, Phoenix, both of Ariz.

[73] Assignee: Motorola, Inc., Franklin Park, Ill.

[22] Filed: Sept. 1, 1971

[21] Appl. No.: 176,818

[52] U.S. Cl. ............... 317/235, 29/584, 307/299 B, 330/30 D, 317/234 N, 317/235 E, 317/235 Y, 317/235 Z

[51] Int. Cl. ............................................ H01l 19/00

[58] Field of Search .................... 317/235 Y, 235 Z, 317/234 N; 324/158 T; 330/38 R, 38 M, 30 D; 29/574, 584

[56] References Cited

UNITED STATES PATENTS

| | | | |
|---|---|---|---|
| 3,303,400 | 2/1967 | Allison | 317/234 N |
| 3,484,341 | 12/1969 | Devitt | 317/234 N |
| 3,440,554 | 4/1969 | McGraw et al. | 330/30 D |
| 3,487,323 | 12/1969 | Schaeffer | 330/30 D |
| 3,543,102 | 11/1970 | Dahlberg et al | 317/235 Z |
| 3,389,230 | 6/1968 | Hudson | 317/235 Z |
| 3,633,052 | 1/1972 | Hanna | 317/235 Z |
| 3,566,154 | 2/1971 | Loessi et al. | 317/235 Z |

OTHER PUBLICATIONS

Frederiksen et al., Motorola Monitor, April 1970, pp. 24–24 (Vol. 8, No. 1).

*Primary Examiner*—John W. Huckert
*Assistant Examiner*—William D. Larkins
*Attorney*—Mueller & Aichele

[57] ABSTRACT

Two matched lateral PNP current sources supplying operating currents to a monolithic integrated operational amplifier circuit each are comprised of transistors with segmented collector rings. The collector segments are interconnected with the collector conductors by fusible metal links which may be burned out or melted by supplying a pulse of high current through the fusible links. By selectively melting these links, the relative currents supplied by the two current sources may be adjusted during the measuring and probing of the integrated circuit chip prior to its packaging.

11 Claims, 3 Drawing Figures

PATENTED SEP 25 1973 3,761,787

INVENTORS
WALTER RICHARD DAVIS
JAMES E. SOLOMON
BY Mueller & Aichele
ATTORNEYS

METHOD AND APPARATUS FOR ADJUSTING TRANSISTOR CURRENT

BACKGROUND OF THE INVENTION

In the volume production of operational amplifiers, a problem arises with voltage offset in the output of the input stages of the amplifier so that the desired zero temperature coefficient of the amplifier is not obtained and an output offset voltage is produced even if no differential input is applied to the amplifier. Such an offset voltage, with the inputs of the amplifier tied together or at the same potential, often is caused by area mismatching of the emitters of the differential input transistors. Emitter area mismatching of 1 or 2 percent in these transistors causes an offset voltage of about 2.5 to 5 millivolts in a typical application. In addition, if the emitter area of the input transistors differs, the differential output current flowing into the output leads from the input stage does not have a zero temperature coefficient since the current changes in the emitters of the slightly mismatched differential input amplifier transistors with changes in temperature do not track one another.

Such an undesirable offset voltage can be reduced to zero by using resistors in the collector circuits of the input differential transistors and by adjusting the resistors until the offset voltage is reduced to zero. This can be accomplished by using potentiometers or other techniques which permit adjustment of the relative values of resistance in the collector paths for the transistors. Another way to reduce the voltage offset to zero is to use a potentiometer resistor connected between the emitters of the differential input stage with the slide of the potentiometer resistor being connected to the current source for the input differential amplifier. These techniques, however, do not give a zero temperature coefficient effect.

The use of resistors or potentiometers also is not practical for a low power operational amplifier circuit made in integrated circuit form. The reason for this is that on an integrated circuit chip, the collector current for the transistors of the input differential amplifier may be of the order of 1 microamp and can be as low as 0.1 microamp. Therefore, to get approximately one volt drop across a resistor or a potentiometer (required for a reasonable gain in the first stage) such a resistor or potentiometer would be several megohms or more. It is not practical to put resistors of that value on a chip because of the extremely large area which would be consumed by such large resistors. Typically, a 1 megohm resistor fabricated by present integrated circuit techniques would require about 1,000 square mils plus interconnecting pads and conductors and necessary spacing from other components.

SUMMARY OF THE INVENTION

Accordingly, it is an object of this invention to provide an improved operational amplifier capable of adjustment of offset voltage.

It is a second object of this invention to provide an improved method for adjusting the current conducting characteristics of an integrated circuit transistor.

It is another object of this invention to supply collector currents to the transistor of the input stage of an operational amplifier through matched transistor current sources each capable of adjustment without the use of adjusting resistors.

It is an additional object of this invention to adjust the effective area of an electrode of a transistor.

It is yet another object of this invention to fabricate one of the electrodes of a transistor in the form of a plurality of segments interconnected by fusible links which may be opened to reduce the effective area of the electrode of the transistor.

It is still another object of this invention to fabricate a transistor having a segmented electrode, with one of the segments connected to a conductor for that electrode and further connected by a fusible link to another of the segments.

In accordance with a preferred embodiment of this invention, the current conducting characteristics of a transistor are adjusted by forming the collector electrodes of the transistor as a plurality of separated segments. Pairs of the plurality of segments are interconnected by fusible conductive links having a predetermined melting temperature which is greater than the temperature attained in operation of the transistor. Selected ones of the links are heated above their melting point to melt the links and sever the conductive connection between the segments which were interconnected by such selected links to reduce the effective area of the segmented electrode.

In a monolithic integrated circuit at least one transistor is provided for conducting current through its collector-emitter path and at least one of the collector and emitter electrodes is comprised of at least two segments. One of the segments is connected with the conductor for the collector-emitter path of the transistor and the other segment is connected through a fusible link to the segment connected to the conductor. The fusible link has a predetermined melting temperature which is above the temperature normally attained during the operation of the transistor; but if it is desirable to reduce the effective area of the electrode, a current of sufficient magnitude to melt the fusible link is applied through it. When this is done, the interconnection between the segments is broken. This reduces the effective area of the electrode, thereby reducing the collector current of the transistor for the same set of operating conditions.

DETAILED DESCRIPTION

Figure 1:
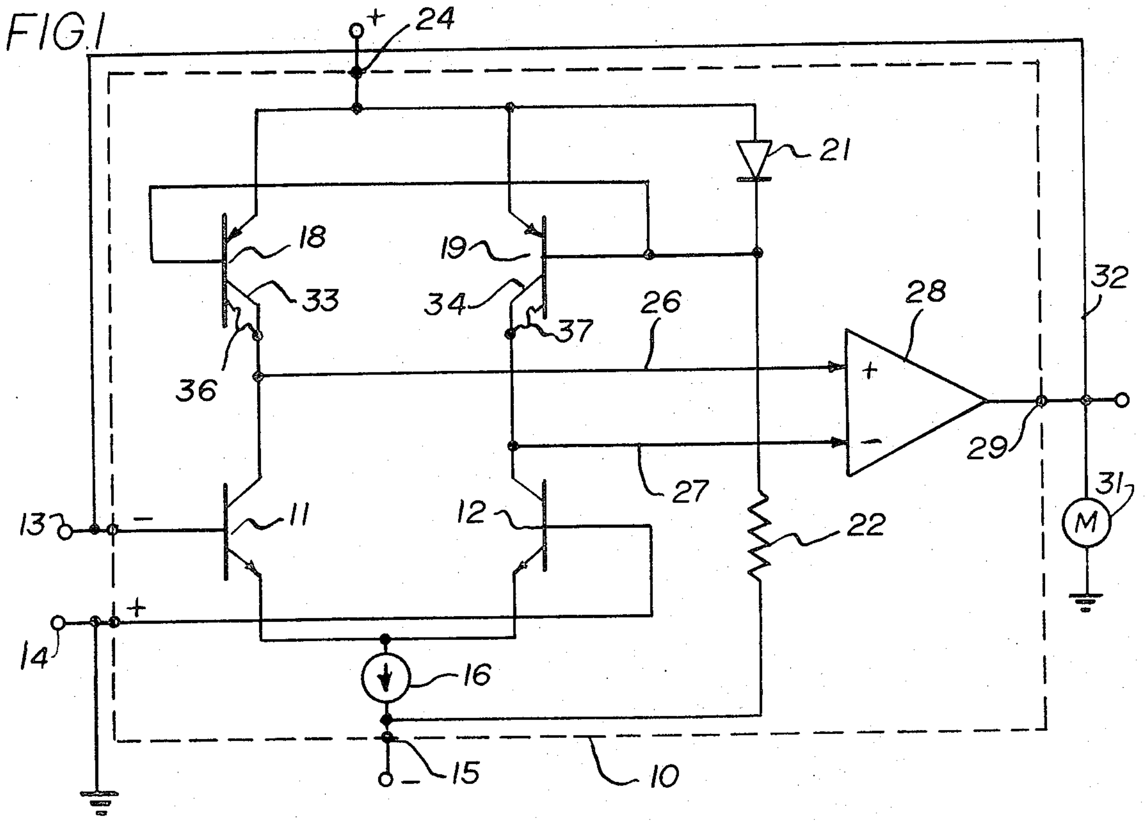
FIG. 1 is a schematic diagram illustrating a preferred embodiment of the invention.

Referring now to FIG. 1, there is shown enclosed within the dotted lines an operational amplifier circuit 10 which may be fabricated as a monolithic integrated circuit. The input stage of the operational amplifier includes a pair of matched NPN transistors 11 and 12, the bases of which are supplied with differential input currents on a pair of input terminals 13 and 14. The emitters of the transistors 11 and 12 are interconnected through a suitable current source 16 to a negative power supply bonding pad 15, connected to a suitable source of B- operating potential (not shown). Operating current for the collectors of the transistors 11 and 12 is provided from a pair of lateral PNP current source transistors 18 and 19, respectively, the bases of which are connected to the junction between a diode 21 and resistor 22 forming a voltage divider between a positive power supply bonding pad 24 and the bonding pad 15. A suitable source of B+ operating potential (not shown) is connected to the bonding pad 24 to which the emitters of both of the lateral PNP transistors 18 and 19 also are connected.

Output signals from the input stage of the operational amplifier are obtained from the collectors of the transistors 11 and 12 and are applied on a pair of leads 26 and 27, respectively, to the two inputs of an output amplifier stage 28 which then produces output signals on an output bonding pad 29.

In the absence of any differential input, for example, with the input terminals 13 and 14 interconnected to the same potential, the transistors 11 and 12 should be equally conductive since they are matched. In addition, the lateral PNP current source transistors 18 and 19 also are fabricated to be matched, so that they should supply equal currents to the collectors of the transistors 11 and 12. It has been found, however, that in volume production the emitter areas of the transistors 11 and 12 may vary slightly. This slight mismatching and similar mismatching of the current source transistors 18 and 19 produces an offset voltage across the leads 26 and 27 even though no differential input is applied to the input terminals 13 and 14. During the manufacturing process prior to the time that the integrated circuit 10 has leads connected to the external bonding pads and is packaged, it is tested to ascertain that it is operating correctly. This testing is accomplished by application of operating potentials to selected points in the circuit and by measuring the operating characteristics of the circuit at probe points located throughout the circuit. One of these probe points is at the output bonding pad 29. A meter 31 may be connected between ground and the bonding pad 29 and the meter then indicates the offset voltage for the circuit in the absence of a differential input with the amplifier connected for unity voltage gain. This is accomplished by connecting the output bonding pad 29 to the input bonding pad 13 over the lead 32, with zero volts (ground) applied to the input bonding pad 14, as shown. If an offset voltage is indicated by the meter 31 during this probing operation, it is desirable to adjust the relative currents supplied to the collectors of the transistors 11 and 12 to compensate for or elimninate this undesirable offset voltage. The particular current path to which the adjustment should be made is determined by the sign of the detected offset voltage indicated by the meter 31.

To accomplish such adjustment in the offset voltage, the collectors of the lateral PNP current source transistors 18 and 19 are fabricated as multiple-section collectors with a main current conducting portion thereof illustrated in FIG. 1 as a first collector segment 33 for the transistor 18 and as a first collector segment 34 for the transistor 19. The segments 33 and 34 carry the major portion of the total collector current for the transistors 18 and 19. This major current, however, is supplemented by a small additional collector current which is obtained from a second collector segment for each of the transistors 18 and 19. This second collector segment is connected in parallel with the collector segments 33 and 34 through fusible links 36 and 37, and the percentage of the total collector current which is carried by the links 36 and 37 is determined by the area of the supplemental collector segments connected to these links relative to the total collector area as constituted by the primary collector segments 33 and 34 and the supplemental collector segments.

Since the transistors 11 and 12 and 18 and 19 are nominally matched, only a small adjustment in current generally is required to compensate for an undesirable voltage offset. As a consequence, the collector segments which are connected in parallel with the major collector segments 33 and 34 by the fusible links 36 and 37 are quite small in area relative to the area of the collector segments 33 and 34. If an offset voltage is detected by the meter 31, the one of the transistors 18 or 19 which is conducting the greater current has a relatively high current pulse applied across the corresponding fusible link 36 or 37. This current pulse is of sufficient magnitude to heat the fusible link 36 or 37 to its melting point, thereby "burning out" the fusible link and opening the conductive path between its collector segment and the remainder of the circuit.

Thus, the effective collector area of the transistor 18 or 19 which is subjected to this operation is reduced, thereby reducing the total collector current by a small fraction. This technique can be used to reduce or eliminate the offset voltage. In addition, the adjustment of effective collector area also causes the composite circuit comprised of the transistors 11, 12, 18 and 19 to have substantially a zero temperature coefficient of operation.

Although only two collector segments for each of the transistors 18 and 19 are shown in FIG. 1 it should be noted that additional segments could be employed if the need for additional or a finer degree of adjustment is required, the number of collector segments would depend, of course, upon the total current required to be carried by the multiple segment transistor and the geometry restraints which must be followed in fabricating the lateral PNP transistors 18 and 19.

During subsequent operation of the circuit as an amplifier, the meter 31 is removed and the feedback connection between the bonding pads 29 and 13 may be varied as required by the operating characteristics desired from the circuit. Also, the connection of the bonding pad 14 directly to ground may be broken with input signals being applied to the pad 14.

Figure 2:
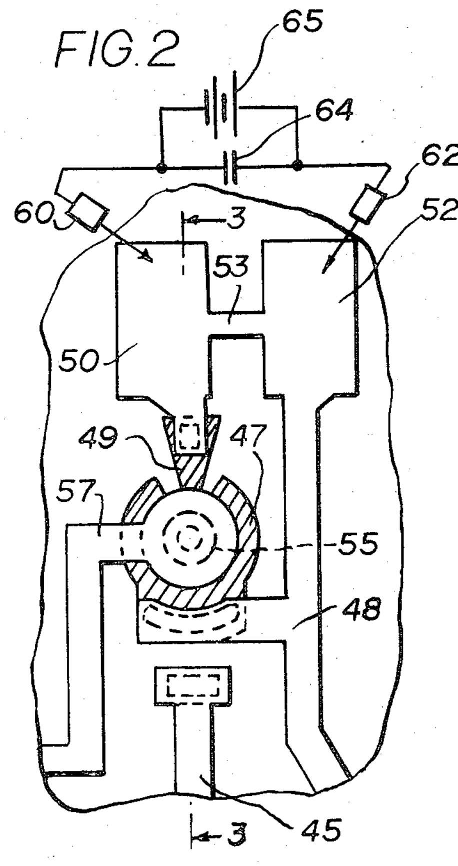
FIG. 2 is a diagrammatic representation of a transistor in accordance with a preferred embodiment of the invention.
Figure 3:
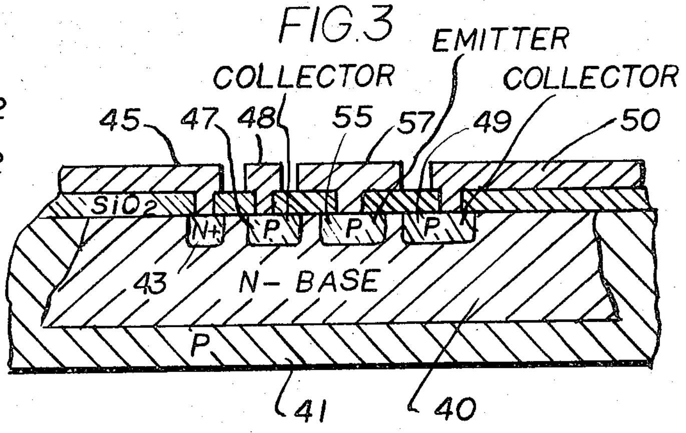
FIG. 3 is a cross section of the transistor shown in FIG. 2 taken along with line 3—3.

Referring now to FIGS. 2 and 3, there is shown in FIG. 2 a magnified portion of the layout of the integrated circuit 10 including one of the transistors 18 or 19. FIG. 3 is a cross section of the transistor shown in FIG. 2. Since the transistors 18 and 19 are lateral PNP transistors, they include an N-epitaxial layer 40 formed in a P-type substrate 41 as shown in FIG. 3. The N-epitaxial layer 40 forms the base of the transistor and a base connection is made to the layer 40 through an N+ diffusion 43 to which is connected the base electrode conductor 45 illustrated in both FIGS. 2 and 3.

The collector of the transistor shown in FIGS. 2 and 3 is a circular segmented collector comprising a major portion 47 to which a collector conductor 48 is connected. The collector segment 47 corresponds to the collector segment 33 or 34 of the transistors 18 and 19 in FIG. 1. This segment does not form a complete circle, however, but is interrupted (as best seen in FIG. 2). An additional collector segment 49 of a much smaller overall area than the area of the major collector segment 47 is located in the gap between the ends of the segment 47.

The collector segment 49 is connected to a probe pad 50 which is approximately two by three mils in size, so that it is large enough to accommodate a test probe in the test fixture in which the integrated circuit is tested prior to final assembly in a package. A similar probe pad 52 is connected by a branch of the collector conductor 48 to the collector segment 47, and the two probe pads 50 and 52 are interconnected by a fusible link 53. The emitter 55 of the transistor is a circular P-diffusion in the center of the ring formed by the collector segments 47 and 49, and a connection to this emitter is made by an emitter conductor 57.

The fabrication of the transistor shown in FIGS. 2 and 3 may be effected by standard integrated circuit techniques, and the conductors 45, 48, 57, the probe pads 50, 52 and the fusible link 53 all are made simultaneously in the same step out of the same material, which typically is aluminum. The width of the fusible link 53 (typically 0.4 mils) is made less than the width of the conductors 45, 48 and 57 (typically 0.5 to 0.6 mils), so that its current carrying capacity is less than that of these conductors. Under normal operation of the transistor, however, the currents carried by the fusible link 53 and by the conductors 45, 48 and 57 are much lower than the currents which would heat the metal of the link 53 and these conductors to its melting point. In the normal operation of the transistor, with the link 53 intact, the current carried by the collector segment 49 and, therefore, by the link 53 is approximately 5 to 10 percent of the total collector current for the transistor.

If, during the testing of the circuits shown in FIG. 1, the reading of the meter 31 indicates that it is desirable to reduce the current carried by one or the other of the transistors 18 and 19, a pair of probes 60 and 62 are applied to the probe pads 50 and 52, respectively, for the transistor in which the link 53 is to be severed to reduce the current carried by the corresponding transistor. The probes 60 and 62 are connected across opposite ends of a charge storage capacitor 64 which has a large capacitance, typically of the order of 10 microfarads, and which is charged from a DC voltage source 65 having a value of 15 to 40 volts.

When the probes 60 and 62 contact the pads 50 and 52, the capacitor 64 essentially is short-circuited across the link 53 and causes a high value current pulse to be applied through the link 53. This current pulse is of sufficient magnitude to cause the link 53 to be heated up past its melting point thereby causing the link 53 to be burned out opening the circuit between the pads 50 and 52. This in effect removes the collector segment 49 from the operation of the circuit in the transistor which has had the link 53 severed. Thus, the effective collector area of the transistor is reduced by the amount of reduction effected by removing the collector segment 49 from the circuit. In the example given, this then reduces the collector current by the 5 or 10 percent which previously was carried by the collector segment 49.

During operation of the amplifier circuit 10 the current flowing through an unsevered link 53 is less than a microamp, and the short circuiting current pulse which is applied through a fusible link 53 to cause the link to be burned out is of the order of an amp or more. Thus there is a million to one ratio of the "burn out" current to the operating current for the transistor, so that there is no danger of accidental burning out or melting of a fusible link 53 (FIG. 2) or 36 or 37 (FIG. 1) during the normal operating conditions for the operational amplifier.

As stated previously, more than two segments could be employed for the segmented collector, with interconnections between the collector segments being effected by the use of probe pads and fusible links of the type shown in FIG. 2. The minimum size for the segment 49 is determined by the resolution which can be obtained from the cameras used to produce the masks for the integrated circuit, and the number of segments which may be used also is limited by the spacing which must be provided between the segments, the total collector current desired, and the size of the circle from which the collector segments are made.

The fabrication of the circuit and its adjustment as outlined above result in a practical very low power operational amplifier circuit since no resistors or only very low value resistors are needed in the current paths which include the transistors 11, 18 and 12, 19. By using high beta transistors for the transistors 11 and 12, the circuit will operate with very low input currents in the picoamp range.

We claim:

1. A method of adjusting the current conducting characteristics of an integrated circuit transistor including the steps of:

forming the collector of said transistor as a plurality of separated segments;

interconnecting pairs of said plurality of collector segments with fusible conductive links having a predetermined melting temperature greater than the temperature attained in normal operation of said transistor so that said transistor is capable of conducting collector current in excess of a desired amount, for a given bias condition; and heating selected ones of said links to a temperature greater than said predetermined melting temperature to melt such links and sever the conductive connection between the collector segments which were interconnected thereby to reduce the collector current which said transistor is capable of conducting to said desired amount, for said given bias condition.

2. The method according to claim 1 wherein the step of heating said links comprises applying current of sufficient magnitude thereto to heat such selected links to a temperature above said predetermined melting temperature.

3. The method according to claim 2 whereby the step of applying said sufficient current through said selected ones of said links comprises the step of discharging a capacitor through each selected link, with the current through a link resulting from such discharge being several orders of magnitude greater than the current carried by such link in normal operation of said transistor.

4. The combination according to claim 3 wherein said step of discharging a capacitor is effected by touching first and second conductive probes to opposite ends of a selected link, with the first and second probes being connected to opposite ends of said capacitor.

5. The method of adjusting voltage offset between two conductive paths of an integrated circuit in which each of the conductive paths includes a transistor, the collectors of which are comprised of a plurality of separated segments, pairs of which segments are interconnected by fusible conductive links each having a predetermined melting temperature greater than the temperature attained by said links during normal operation of said transistors, the method comprising the steps of:

measuring the voltage offset between said first and second current paths; and applying sufficient current through selected ones of said links to heat such links above said predetermined melting temperature, melting such links and severing the conductive connection between the collector segments which were connected thereby to reduce said voltage offset.

6. An integrated circuit including in combination:

at least one transistor having collector, base, and emitter electrodes, with at least one of the collector and emitter electrodes comprised of at least two segments, one segment having greater area than the other;

a conductor having a predetermined minimum width and thickness sufficient to carry operating current for said one electrode;

means for connecting said one of said segments having the greater area with said conductor;

a conductive fusible link interconnecting said segments, said fusible link having a predetermined melting temperature greater than the temperature attained by such link during normal operation of said transistor; and means at each end of said fusible link for permitting the application thereto of a current having a magnitude sufficient to heat said link to a temperature above said predetermined melting temperature thereby melting said link and severing the interconnection between said segments.

7. A monolithic integrated circuit having a P substrate including in combination:

at least one lateral PNP transistor having collector, base and emitter electrodes, with an N base diffusion in said P substrate, said collector electrode comprised of at least two segments;

a conductor having a predetermined minimum width and thickness sufficient to carry operating current for said collector electrode;

means for connecting one of said segments with said conductor;

a conductive fusible link interconnecting said segments of said collector, said fusible link having a predetermined melting temperature greater than the temperature obtained by said link during normal operation of said transistor; and means at each end of said fusible link for permitting the application thereto of a current having a magnitude sufficient to heat said link to a temperature above said predetermined melting temperature, thereby melting said link and severing the interconnection between said segments, the relative sizes of said segments determining the percentage of total current conducted by said collector.

8. The combination according to claim 1 wherein said collector electrode is a generally circular electrode with a first one of said segments occupying the greater part of said circle and a second one of said segments occupying a lesser part, said conductor being connected with the first segment and the fusible link interconnecting the first and second segments, the fusible link and conductor being integrally formed of the same material, with the width of the fusible link being less than the width of said conductor.

9. A monolithic integrated circuit operational amplifier permitting current offset adjustment including in combination:

first and second separate current paths having conductors and having a predetermined differential current offset therebetween in the absence of any input signals to said operational amplifier;

first and second transistors each having collector, base, and emitter electrodes, with the emitter-collector paths thereof connected respectively in series in said first and second current paths, at least one of the collector and emitter electrodes of each of said first and second transistors being comprised of at least two segments with one of the segments of each such segmented electrode being connected to the corresponding separate conductor for said first and second current paths;

fusible conductive means having a predetermined melting temperature for connecting the other segment of each of such segmented electrodes in each of said transistors with said one segment; and means for permitting the selective application of a current to said fusible conductive means of sufficient magnitude to heat said fusible conductive means to a temperature in excess of said predetermined temperature thereby breaking the connection between said segments.

10. The combination according to claim 9 wherein said first and second transistors comprise lateral PNP current source transistors for supplying currents having a predetermined offset, and said electrode having said segments comprises the collector of each of said first and second transistors.

11. The combination according to claim 10 wherein each of said lateral PNP transistors includes a segmented circular collector electrode substantially surrounding an emitter electrode, with said one of said segments constituting the greater part of the circle occupied by said collector electrode and said other of said segments constituting a lesser part of the circle.

* * * * *